United States Patent
Kitagawa et al.

(10) Patent No.: US 12,291,545 B2
(45) Date of Patent: May 6, 2025

(54) RARE EARTH COMPLEX, RARE EARTH COMPLEX SOLUTION, LUMINESCENT MOLDED ARTICLE, METHOD FOR PRODUCING LUMINESCENT PRODUCT, LUMINESCENT SHEET, AND VINYL GREENHOUSE FOR AGRICULTURE

(71) Applicant: NATIONAL UNIVERSITY CORPORATION HOKKAIDO UNIVERSITY, Sapporo (JP)

(72) Inventors: Yuichi Kitagawa, Sapporo (JP); Kaori Shima, Sapporo (JP); Satoshi Wada, Sapporo (JP); Yasuchika Hasegawa, Sapporo (JP); Koji Fushimi, Sapporo (JP)

(73) Assignee: NATIONAL UNIVERSITY CORPORATION HOKKAIDO UNIVERSITY, Sapporo (JP)

( * ) Notice: Subject to any disclaimer, the term of this patent is extended or adjusted under 35 U.S.C. 154(b) by 835 days.

(21) Appl. No.: 17/606,256

(22) PCT Filed: Apr. 23, 2020

(86) PCT No.: PCT/JP2020/017569
§ 371 (c)(1),
(2) Date: Oct. 25, 2021

(87) PCT Pub. No.: WO2020/218451
PCT Pub. Date: Oct. 29, 2020

(65) Prior Publication Data
US 2022/0315613 A1    Oct. 6, 2022

(30) Foreign Application Priority Data
Apr. 26, 2019 (JP) .................. 2019-085626

(51) Int. Cl.
C07F 9/53 (2006.01)
A01G 9/14 (2006.01)
C07F 5/00 (2006.01)
C09K 11/06 (2006.01)

(52) U.S. Cl.
CPC .................. *C07F 9/53* (2013.01); *A01G 9/14* (2013.01); *C07F 5/00* (2013.01); *C09K 11/06* (2013.01)

(58) Field of Classification Search
CPC ... C07F 9/53; C07F 5/00; C09K 11/06; A01G 9/14
See application file for complete search history.

(56) References Cited

U.S. PATENT DOCUMENTS

| | | | |
|---|---|---|---|
| 2008/0303426 A1 | 12/2008 | Iwanaga et al. | |
| 2009/0050851 A1 | 2/2009 | Sato et al. | |

FOREIGN PATENT DOCUMENTS

| | | | | |
|---|---|---|---|---|
| CN | 1575066 A | 2/2005 | | |
| CN | 1908112 A | 2/2007 | | |
| CN | 102224150 A | 10/2011 | | |
| CN | 103228641 A | 7/2013 | | |
| CN | 104755513 A | 7/2015 | | |
| CN | 107207958 A | 9/2017 | | |
| JP | 2006213666 A | * | 8/2006 | |
| JP | 2008297250 A | * | 12/2008 | ............ C07F 9/5345 |
| JP | 2016128392 A | * | 7/2016 | |
| JP | 2020-122041 A | | 8/2020 | |
| WO | WO-2010022191 A2 | * | 2/2010 | ........... C09K 11/025 |
| WO | 2018/015557 A1 | | 1/2018 | |
| WO | 2019/053964 A1 | | 3/2019 | |

OTHER PUBLICATIONS

International Preliminary Report on Patentability with translation of the Written Opinion issued Sep. 28, 2021 in International Application No. PCT/JP2020/017569.
International Search Report for PCT/JP2020/017569 dated Jun. 23, 2020.
Japanese Office Action dated Apr. 23, 2024 in Application No. 2021-516219.

* cited by examiner

*Primary Examiner* — Robert D Harlan
(74) *Attorney, Agent, or Firm* — Sughrue Mion, PLLC

(57) ABSTRACT

Disclosed is a rare earth complex having a rare earth ion and a phosphine oxide ligand that is coordinated with the rare earth ion and is represented by the following formula (I):

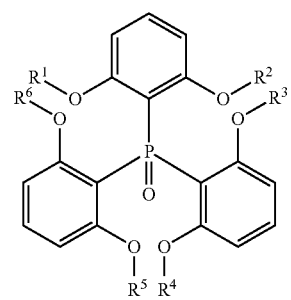

(I)

wherein $R^1$, $R^2$, $R^3$, $R^4$, $R^5$, and $R^6$ each independently represent an alkyl group which may have a substituent.

12 Claims, 6 Drawing Sheets

RARE EARTH COMPLEX, RARE EARTH COMPLEX SOLUTION, LUMINESCENT MOLDED ARTICLE, METHOD FOR PRODUCING LUMINESCENT PRODUCT, LUMINESCENT SHEET, AND VINYL GREENHOUSE FOR AGRICULTURE

CROSS REFERENCE TO RELATED APPLICATIONS

This application is a National Stage of International Application No. PCT/JP2020/017569 filed Apr. 23, 2020, claiming priority based on Japanese Patent Application No. 2019-085626 filed Apr. 26, 2019.

TECHNICAL FIELD

The present invention relates to a rare earth complex, a rare earth complex solution, a luminescent molded article, a method for producing a luminescent molded article, a luminescent sheet, and a vinyl greenhouse for agriculture.

BACKGROUND ART

Patent Literature 1 discloses a rare earth complex that emits light at a high luminance by light irradiation.

CITATION LIST

Patent Literature

Patent Literature 1: International Publication WO 2018/155557

SUMMARY OF INVENTION

Technical Problem

Since a conventional rare earth complex that emits light at a high luminance has a problem in that solubility is low or crystallization easily occurs, it is difficult to form a transparent luminescent molded article containing the rare earth complex.

The present invention provides a rare earth complex that not only emits light at a high luminance but also can easily form a transparent luminescent molded article whose crystallization is suppressed. The present invention further provides a method capable of suppressing the crystallization of a rare earth complex and thereby easily forming a transparent luminescent molded article containing the rare earth complex.

Solution to Problem

An aspect of the present invention relates to a rare earth complex having a rare earth ion and a phosphine oxide ligand that is coordinated with the rare earth ion and is represented by the following formula (I):

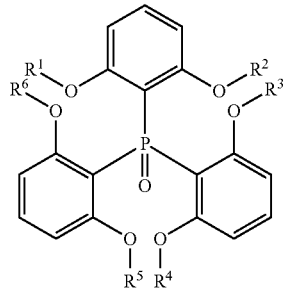

wherein $R^1$, $R^2$, $R^3$, $R^4$, $R^5$, and $R^6$ each independently represent an alkyl group which may have a substituent.

Another aspect of the present invention relates to a rare earth complex solution containing: the above-described rare earth complex; and a solvent in which the rare earth complex is dissolved.

Still another aspect of the present invention relates to a rare earth complex solution containing: a rare earth complex; an aromatic compound that reduces the crystallinity of the rare earth complex; and a solvent in which the rare earth complex and the aromatic compound are dissolved.

Still another aspect of the present invention relates to a method for producing a luminescent molded article, the method including: forming a membrane of the above-described rare earth complex solution on a base material; and removing the solvent from the membrane to thereby form a membranous luminescent molded article containing the rare earth complex.

Still another aspect of the present invention relates to a luminescent molded article containing a rare earth complex having a phosphine oxide ligand represented by formula (I).

Still another aspect of the present invention relates to a luminescent molded article containing: a rare earth complex; and an aromatic compound that reduces the crystallinity of the rare earth complex.

Still another aspect of the present invention relates to a luminescent sheet containing: a transparent base material film; and a membranous luminescent molded article provided on the transparent base material film. The luminescent molded article is the above-described luminescent molded article.

Still another aspect of the present invention relates to a vinyl greenhouse for agriculture having the above-described luminescent sheet.

Advantageous Effects of Invention

According to the present invention, there is provided a rare earth complex that not only emits light at a high luminance but also has can easily form a transparent luminescent molded article whose crystallization is suppressed. According to the present invention, there is also provided a method capable of suppressing the crystallization of a rare earth complex and thereby easily forming a transparent luminescent molded article containing the rare earth complex.

DESCRIPTION OF EMBODIMENTS

Figure 1:
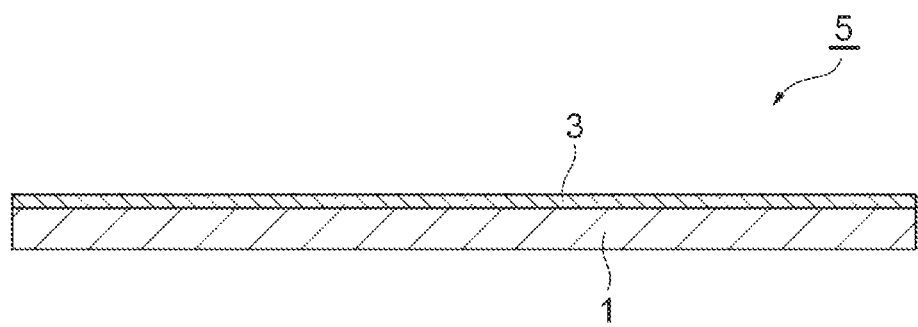
FIG. 1 is a cross-sectional view illustrating an embodiment of a luminescent sheet.

Hereinafter, some embodiments of the present invention will be described in detail. However, the present invention is not limited to the following embodiments.

A rare earth complex according to an embodiment has a rare earth ion and a phosphine oxide ligand that is coordinated with the rare earth ion and is represented by the following formula (I).

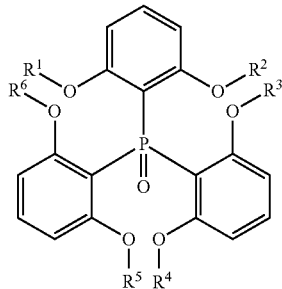

(I)

The rare earth ion is typically a trivalent rare earth ion. The rare earth ion can be appropriately selected depending on luminescent color or the like. The rare earth ion can be, for example, at least one selected from the group consisting of Eu(III) ion, Tb(III) ion, Gd(III) ion, Sm(III) ion, Yb(III) ion, Nd(III) ion, Er(III) ion, Y(III) ion, Dy(III) ion, Ce(III) ion, and Pr(III) ion. From the viewpoint of obtaining a high emission intensity, the rare earth ion may be Eu(III) ion, Tb(III) ion, or Gd(III) ion.

In Formula (I), $R^1$, $R^2$, $R^3$, $R^4$, $R^5$, and $R^6$ each independently represent an alkyl group which may have a substituent. The alkyl group for $R^1$ to $R^6$ may be in a linear form, a branched form, a cyclic form, or a combination thereof, and the number of carbon atoms may be 1 to 20, 1 to 15, 1 to 10, 1 to 5, or 1 to 3. The substituent bonded to the alkyl group can be, for example, a halogeno group. $R^1$ to $R^6$ each independently may be a methyl group, an ethyl group, or a propyl group.

The rare earth complex according to the embodiment may further have another ligand other than the phosphine oxide ligand of formula (I). For example, the rare earth complex may have one rare earth ion, two phosphine oxide ligands of formula (1), and three other ligands.

The other ligands can be a ligand having a light sensitizing action. The ligand having a light sensitizing action can be arbitrarily selected from compounds having a light sensitizing action with respect to the rare earth ion. The ligand having a light sensitizing action may be a monodentate ligand or a bidentate ligand.

The ligand having a light sensitizing action may be a heteroaromatic compound that has a heteroaromatic group containing a ligand atom (for example, a nitrogen atom). Examples of the heteroaromatic compound that may be used as the ligand having a light sensitizing action include a compound represented by the following formula (21):

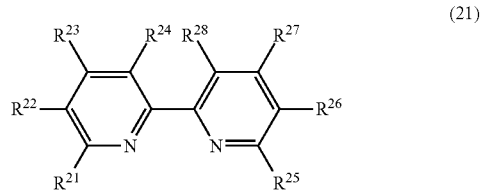

(21)

In formula (21), $R^{21}$, $R^{22}$, $R^{23}$, $R^{24}$, $R^{25}$, $R^{26}$, $R^{27}$, and $R^{28}$ each independently represent a hydrogen atom, an alkyl group having 1 to 3 carbon atoms or an aryl group having 6 to 12 carbon atoms, or groups which are linked to each other to form a condensed ring together with a pyridine ring bonded thereto. The number of carbon atoms of the alkyl group may be 1 to 3 or 1. The number of carbon atoms of the aryl group may be 6 to 12 or 6 to 10.

The compound represented by formula (21) may be a phenanthroline compound represented the following formula (21a):

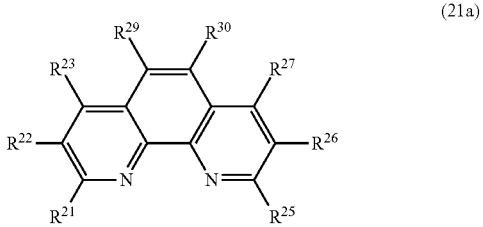

(21a)

In formula (21a), $R^{21}$, $R^{22}$, $R^{23}$, $R^{25}$, $R^{26}$, and $R^{27}$ are defined in the same way as in formula (1). $R^{29}$ and $R^{30}$ each independently represent a hydrogen atom, an alkyl group having 1 to 3 carbon atoms, or an aryl group having 6 to 12 carbon atoms. The number of carbon atoms of the alkyl group may be 1 to 3 or 1. The number of carbon atoms of the aryl group may be 6 to 12 or 6 to 10. $R^{21}$, $R^{22}$, $R^{23}$, $R^{25}$, $R^{26}$, $R^{27}$, $R^{29}$, and $R^{30}$ may be a hydrogen atom.

As another example of the ligand having a light sensitizing action, a compound represented by Formula (22) or (23) below is exemplified.

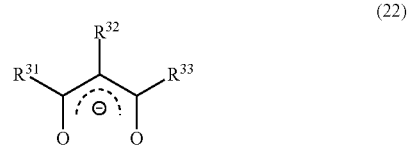

(22)

In formula (22), $R^{31}$, $R^{32}$, and $R^{33}$ each independently represent a hydrogen atom, an alkyl group having 1 to 15 carbon atoms, an alkyl halide group having 1 to 5 carbon atoms, an aryl group, or a heteroaryl group. The number of carbon atoms of the alkyl group and the alkyl halide group may be 1 to 5 or 1 to 3. The alkyl group may be a tertiary butyl group. The halogen of the alkyl halide group may be, for example, fluorine. Examples of the aryl group or the heteroaryl group include a naphthyl group and a thienyl group. In particular, $R^{31}$ and $R^{33}$ may be an alkyl halide group such as a trifluoromethyl group. At this time, $R^{32}$ may be a hydrogen atom (including a deuterium atom).

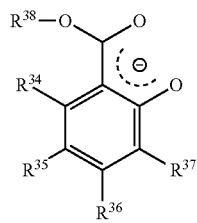
(23)

In Formula (23), $R^{34}$, $R^{31}$, $R^{36}$, $R^{37}$, and $R^{38}$ each independently represent a hydrogen atom, an alkyl group having 1 to 5 carbon atoms, or a alkyl halide group having 1 to 5 carbon atoms. The number of carbon atoms of the alkyl group and the alkyl halide group may be 1 to 5 or 1 to 3. The halogen of the alkyl halide group may be, for example, fluorine. In particular, $R^{34}$, $R^{35}$, $R^{36}$, $R^{37}$, and $R^{38}$ may be a hydrogen atom.

The rare earth complex may have a coordinating solvent like water or alcohol such as methanol.

A rare earth complex solution according to an embodiment contains the rare earth complex described above and a solvent in which the rare earth complex is dissolved. This rare earth complex solution can be used, for example, as a molding material for forming a luminescent molded article containing the rare earth complex.

The solvent can be arbitrarily selected from those dissolving the rare earth complex. The solvent may be, for example, acetone, tetrahydrofuran, dichloromethane, or a combination of two or more kinds selected therefrom.

The concentration of the rare earth complex in the rare earth complex solution may be, for example, 0.1 to 60% by mass, 0.1 to 50% by mass, or 0.1 to 40% by mass, on the basis of the mass of the rare earth complex solution.

The rare earth complex solution according to the above-described embodiment can be easily obtained, for example, by mixing a rare earth complex not having a phosphine oxide ligand of formula (I) and a phosphine oxide ligand of formula (1) in a solvent. The equivalent ratio (molar ratio) of the phosphine oxide ligand of formula (1) with respect to the rare earth complex not having the phosphine oxide ligand of Formula (I) may be 1.8 or more, 1.9 or more, or 2.0 or more, and may be 10 or less, 8.0 or less, 6.0 or less, or 4.0 or less. When the equivalent ratio is within these ranges, the phosphine oxide ligand of formula (1) may often be generated by rapid ligand exchange after mixing.

The rare earth complex not having a phosphine oxide ligand of formula (1) may be, for example, a complex having a ligand having a light sensitizing action and another ligand. The other ligand may be a coordinating solvent like water.

The rare earth complex solution may contain an arbitrary luminescent rare earth complex and an aromatic compound that reduces the crystallinity of the rare earth complex. According to the findings of the present inventors, by mixing an aromatic compound with a crystalline rare earth complex, the crystal of the rare earth complex is reduced, and thereby a transparent luminescent molded article whose crystallization is suppressed and various luminescent molded articles having the luminescent molded article can be easily formed. The solvent of this solution can also be arbitrarily selected from those dissolving the rare earth complex. The solvent may be, for example, acetone, tetrahydrofuran, dichloromethane, or a combination of two or more kinds selected therefrom.

The aromatic compound can be, for example, a compound that has an aromatic ring selected from a benzene ring, a naphthalene ring, a phenanthrene ring, and a triphenylene ring and a substituent bonded thereto. The substituent may be a group having a ligand atom (for example, an oxygen atom or a nitrogen atom). More specifically, the aromatic compound may be a compound represented by the following formula (10), (11), (12), or (13).

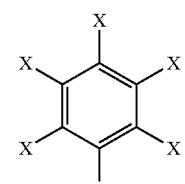
(10)

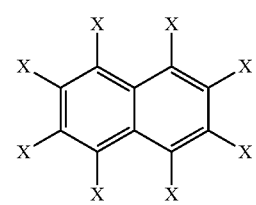
(11)

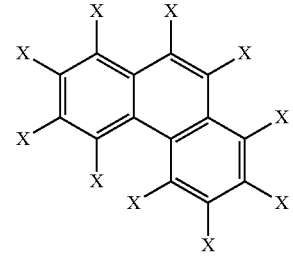
(12)

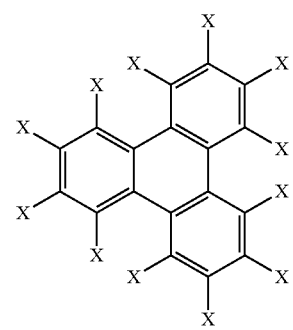
(13)

X in these formulas represents a hydrogen atom, a halogeno group, an alkoxy group which may have a substituent, a hydroxyl group, a nitro group, an amino group which may have a substituent, an alkylsulfonyl group which may have a substituent, an arylsulfonyl group which may have a substituent, a cyano group, a trialkoxysilyl group, a trialkylsilyl group, a phosphonic acid group, a diazo group, an alkylcarbonyloxy group which may have a substituent, an arylcarbonyloxy group which may have a substituent, an alkyloxycarbonyl group which may have a substituent, an aryloxycarbonyl group which may have a substituent, an aldehyde group, or a mercapto group. A plurality of Xs in the same molecule may be the same as or different from each other. One or more of the plurality of Xs in the same molecule is a group containing an oxygen atom or a nitrogen atom. The substituent herein may be, for example, a halogeno group.

The group containing an oxygen atom or a nitrogen atom can be, for example, an alkoxy group which may have a substituent, a hydroxyl group, a nitro group, an amino group which may have a substituent, an alkylsulfonyl group which may have a substituent, an arylsulfonyl group which may have a substituent, a cyano group, a trialkoxysilyl group, a phosphonic acid group, a diazo group, an alkylcarbonyloxy group which may have a substituent, an arylcarbonyloxy group which may have a substituent, an alkyloxycarbonyl group which may have a substituent, an aryloxycarbonyl group which may have a substituent, or an aldehyde group. X may be a hydrogen atom, an alkoxy group which may have a substituent, a hydroxyl group, or an aldehyde group.

The aromatic compound may be a compound represented by the following formula (10a) or (10b).

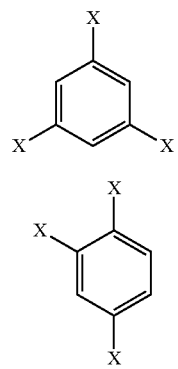

X in formulas (10a) and (10b) has the same meaning as X in Formula (10) (however, excluding a hydrogen atom). X in formulas (10a) and (10b) may be an alkoxy group which may have a substituent, a hydroxyl group, or an aldehyde group.

A rare earth complex combined with the aromatic compound is may be a luminescent rare earth complex, and may or may not have the phosphine oxide ligand of formula (I). The rare earth complex may be, for example, a complex that has a rare earth ion, an arbitrary phosphine oxide ligand, and a ligand having a light sensitizing action. The phosphine oxide ligand in this case may be, for example, a complex having a phosphine oxide ligand represented by formula (14):

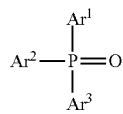

In formula (14), $Ar^1$, $Ar^2$, and $Ar^3$ each independently represent an aryl group which may have a substituent. Examples of the aryl group for $Ar^1$, $Ar^2$, and $Ar^3$ include a phenyl group and a naphthyl group. The substituent that the aryl group for $Ar^1$, $Ar^2$, or $Ar^3$ has can be, for example, a halogeno group. $Ar^1$, $Ar^2$, and $Ar^3$ may be a substituted or unsubstituted phenyl group.

The concentration of the rare earth complex in the rare earth complex solution containing an aromatic compound may be, for example, 0.01 to 60% by mass, 0.01 to 50% by mass, or 0.01 to 40% by mass, on the basis of the mass of the rare earth complex solution. The equivalent ratio (molar ratio) of the aromatic compound relative to the rare earth complex may be 0.01 to 100.

The shape of the luminescent molded article containing the rare earth complex can be a membrane shape, a plate shape, and other arbitrary shapes. For example, by using the aforementioned rare earth complex solution, a membranous luminescent molded article (or a luminescent membrane) that covers the surface of a base material can be easily formed. The base material in this case may be, for example, a base material film, or may be a molded article having any three-dimensional shape.

The content of the rare earth complex in the luminescent molded article may be, for example, 40 to 100% by mass, 50 to 100% by mass, 60 to 100% by mass, 70 to 100% by mass, 80 to 100% by mass, or 90 to 100% by mass, on the basis of the mass of the luminescent molded article.

FIG. 1 is a cross-sectional view illustrating an embodiment of a luminescent sheet having a luminescent membrane that is a membranous luminescent molded article. A luminescent sheet 5 illustrated in FIG. 1 is an example of a luminescent molded article and has a transparent base material film 1 and a luminescent membrane 3 provided on the transparent base material film 1.

Figure 2:
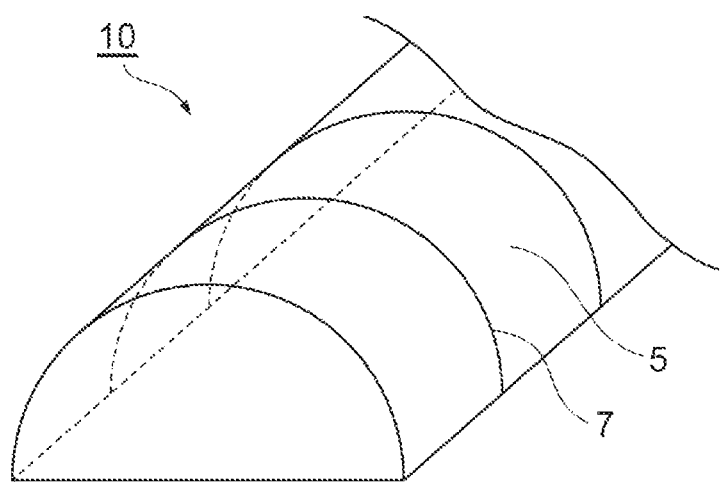
FIG. 2 is a perspective view illustrating an embodiment of a vinyl greenhouse for agriculture.

The luminescent membrane 3 contains a luminescent rare earth complex. By utilizing the property that the rare earth complex emits light of various wavelengths by light irradiation, the luminescent sheet 5 can be used as a member for supplying light whose wavelength is converted into an arbitrary wavelength. For example, a luminescent sheet having a luminescent membrane, which contains the rare earth complex generating red luminescence, can be used for supplying red light to a plant. The red light can promote the growth of a plant. Therefore, the luminescent sheet 5 can be used as a sheet material for a vinyl greenhouse for agriculture. FIG. 2 is a perspective view illustrating an embodiment of a vinyl greenhouse for agriculture. A vinyl greenhouse for agriculture 10 illustrated in FIG. 2 includes a skeleton 7 having a pipe frame and the luminescent sheet 5 covering the skeleton 7.

The transparent base material film 1 can be, for example, a resin film such as a polyvinyl chloride film. The thickness of the transparent base material film 1 is not particularly limited, and may be, for example, about 0.01 to 5 mm. The thickness of the luminescent membrane 3 is not particularly limited, and may be, for example, about 0.01 to 2 mm.

The luminescent sheet 5 can be produced, for example, by a method including: forming a membrane of the aforementioned rare earth complex solution on a transparent base material film and removing the solvent from the membrane to thereby form a membranous luminescent molded article (the luminescent membrane 3).

EXAMPLES

Hereinafter, the present invention will be described in more detail by means of Examples. However, the present invention is not limited to these Examples.

1. Synthesis Example

1-1. Synthesis of tris(2,6-dimethoxyphenyl)phosphine oxide (tdmpo)

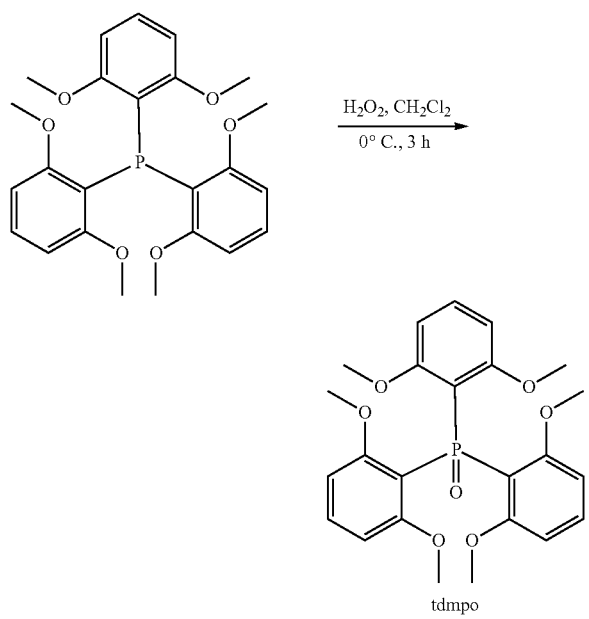

Tris(2,6-dimethoxyphenyl)phosphine (8.84 g, 0.02 mol) was dissolved in dichloromethane (30 mL). While the obtained solution was cooled in an ice bath, a hydrogen peroxide solution (5 mL) was added slowly thereto. After stirring for 3 hours, the product was extracted with dichloromethane and saturated saline, and an organic layer was dehydrated with magnesium sulfate. The dichloromethane was distilled off from the organic layer, thereby obtaining a residue as a crude product. The residue was purified by recrystallization from a mixed solvent of acetone and hexane. The obtained crystal was filtered and washed with acetone, thereby obtaining 3.95 g of a white solid of tdmpo (yield 41%).

$^1$H NMR: δ/ppm=7.23 (t, 3H, J=8 Hz, Ar), 6.48 (dd, 6H, J=8 and 4.8 Hz, Ar), 3.51 (s, 18H, CH$_3$)

ESI-MS (m/z): [M+H]$^+$ calculated for $C_{24}H_{28}O_7P$, 459.15; found, 459.16 Elemental analysis: Calculated for $C_{24}H_{27}O_7P$:C, 62.88%, H, 5.94%.

Found: C, 62.55%, H, 5.88%.

1-2. Synthesis of Eu(hfa)$_3$(tdmpo)$_2$

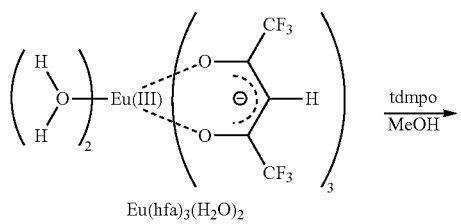

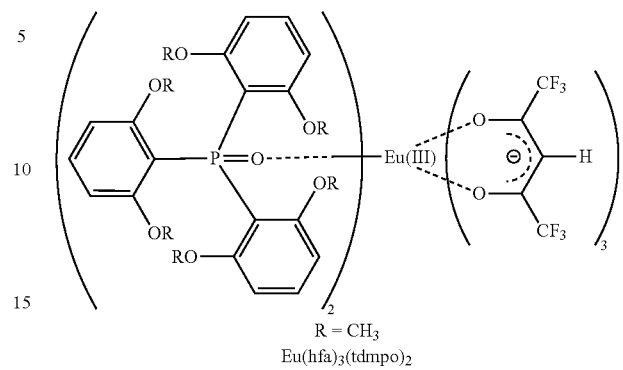

Eu(hfa)$_3$(H$_2$O)$_2$ (16 mg, 0.02 mmol) and tdmpo (14 mg, 0.03 mmol) were dissolved in methanol (10 mL). The methanol was distilled off from the solution, thereby obtaining a white solid of Eu(hfa)$_3$(tdmpo)$_2$. Thereby, it was confirmed that, only by mixing Eu(hfa)$_3$(H$_2$O)$_2$ and tdmpo in the solution, Eu(hfa)$_3$(tdmpo)$_2$ is generated in the solution by rapid ligand exchange.

Mass: [M-hfa]$^+$: $C_{58}H_{56}O_{18}P_2F_{12}$Eu, calcd: 1483.20, found: 1483.11.

2. Luminescence Properties

2-1. Coating to Polyvinyl Chloride Film

Eu(hfa)$_3$(H$_2$O)$_2$ and tdmpo were dissolved in dichloromethane at room temperature. The amount of tdmpo was set to 2 equivalents with respect to Eu(hfa)$_3$(H$_2$O)$_2$. The obtained solution was applied onto a polyvinyl chloride film and the coating film was dried. After drying, a transparent membrane was formed. The formed membrane contains Eu(hfa)$_3$(tdmpo)$_2$, and this is considered not to be substantially crystallized. When the polyvinyl chloride film on which the membrane was formed was irradiated with ultraviolet light, red luminescence was observed.

2-2. Solution of Eu(hfa)$_3$(H$_2$O)$_2$/tdmpo

Figure 3:
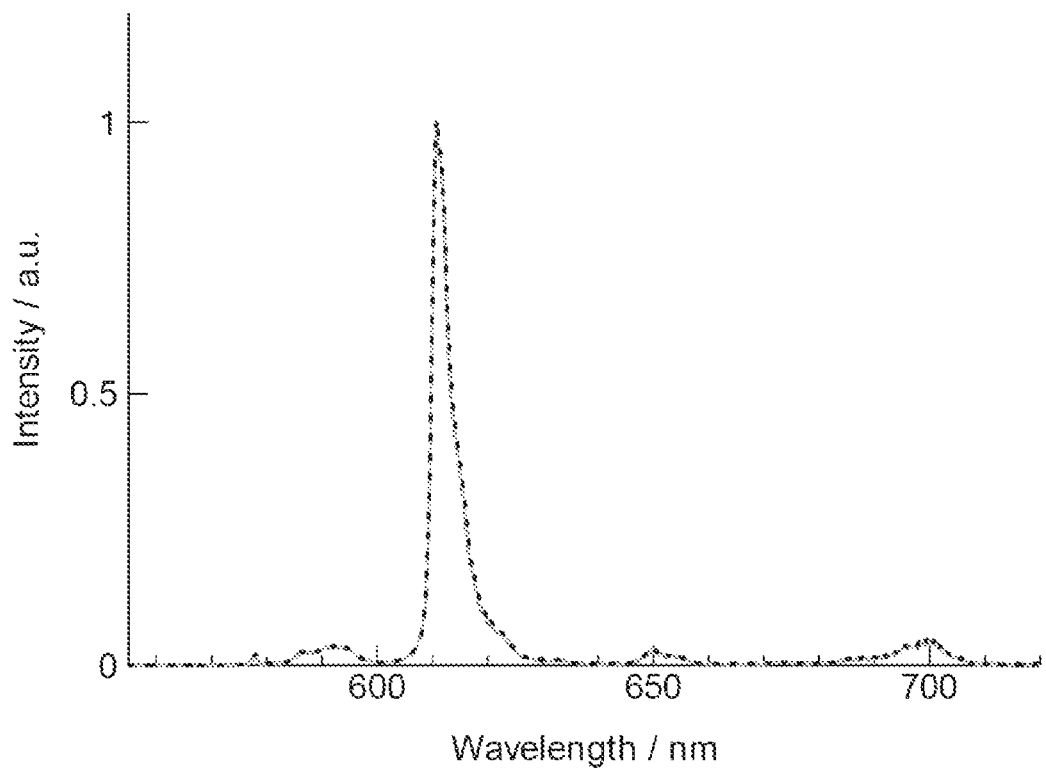
FIG. 3 shows emission spectra of a rare earth complex solution containing Eu(hfa)$_3$(tdmpo)$_2$.
Figure 4:
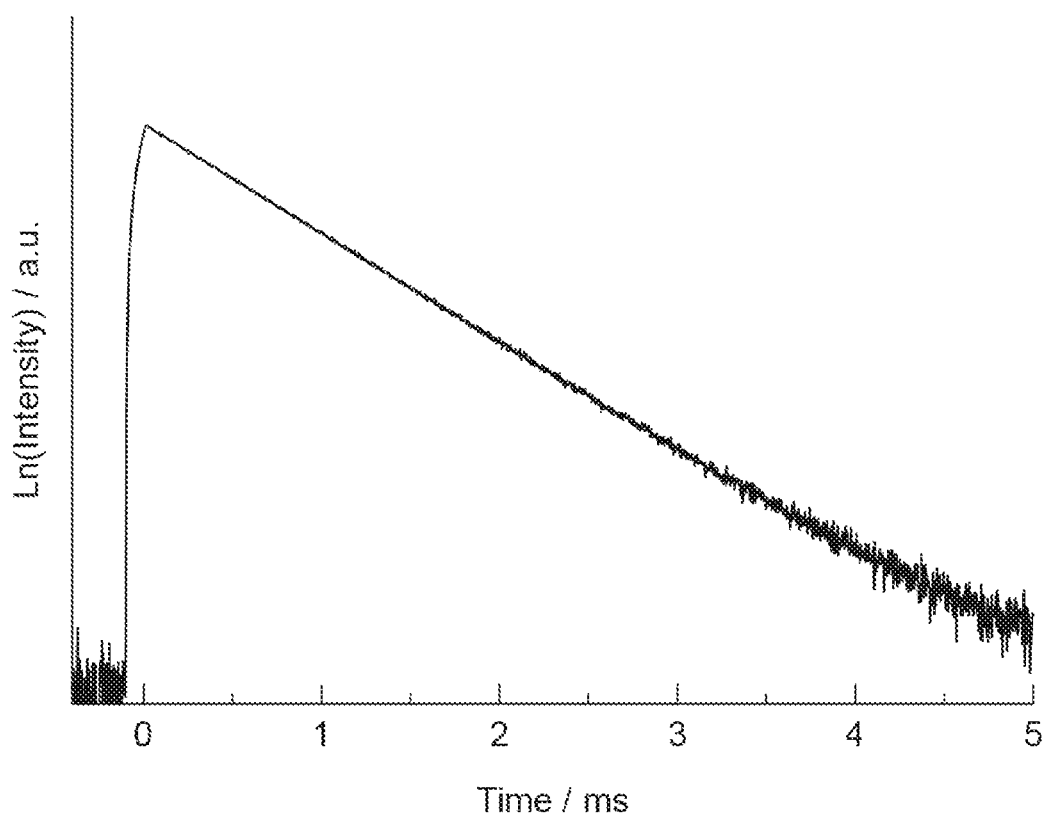
FIG. 4 shows a luminescence decay curve of the rare earth complex solution containing Eu(hfa)$_3$(tdmpo)$_2$.

To 25 mL of dichloromethane at room temperature, Eu(hfa)$_3$(H$_2$O)$_2$ (20 mg, 1 mmol) and 2 equivalents (23 mg, 2 mmol), 3 equivalents (34 mg, 3 mmol), or 6 equivalents (69 mg, 6 mmol) of tdmpo relative to Eu(hfa)$_3$(H$_2$O)$_2$ were added. The luminescence properties of the obtained solution were evaluated. FIG. 3 shows emission spectra (excitation wavelength: 365 nm) of three solutions overlaid one on others. It is considered that these show the luminescence properties of Eu(hfa)$_3$(tdmpo)$_2$ generated in the solution. All of the three solutions showed substantially the same spectrum. FIG. 4 shows a luminescence decay curve (excitation wavelength: 356 nm) of a solution of Eu(hfa)$_3$(H$_2$O)$_2$:tdmpo=1:2 (equivalent ratio). The emission life was 0.7 ms, and the emission quantum yield calculated therefrom was a high value of 50%.

2-3. Solution of Eu(hfa)₃(TPPO)₂/tdmpo

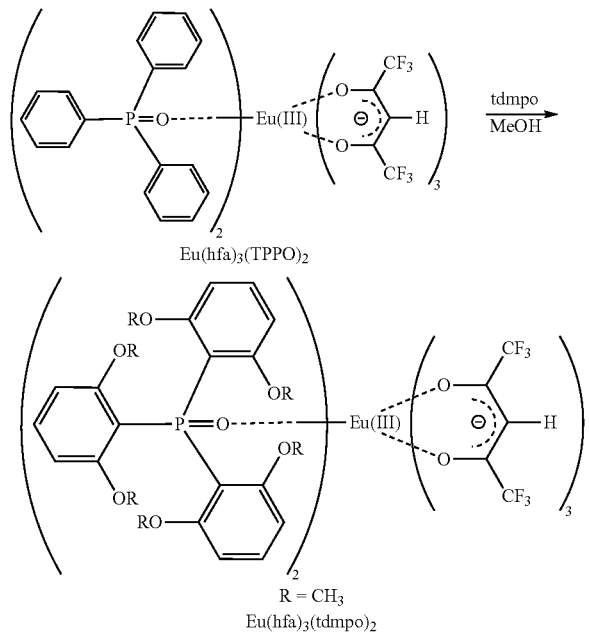

Figure 5:
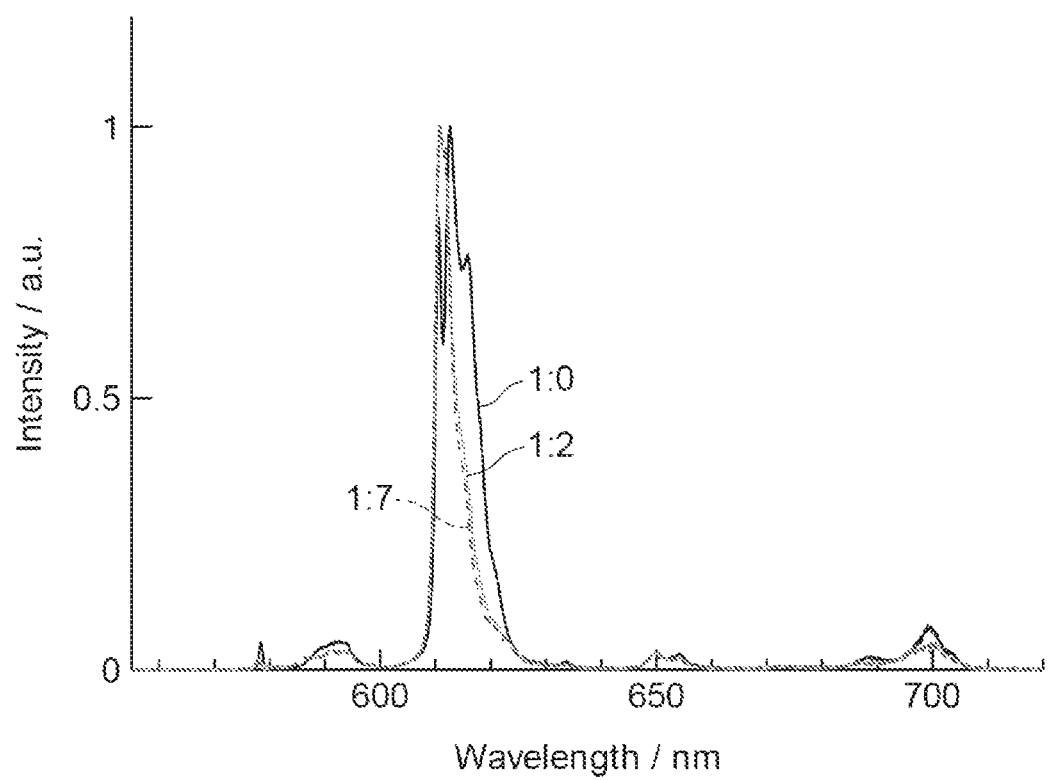
FIG. 5 shows emission spectra of the rare earth complex solution containing Eu(hfa)$_3$(tdmpo)$_2$.
Figure 6:
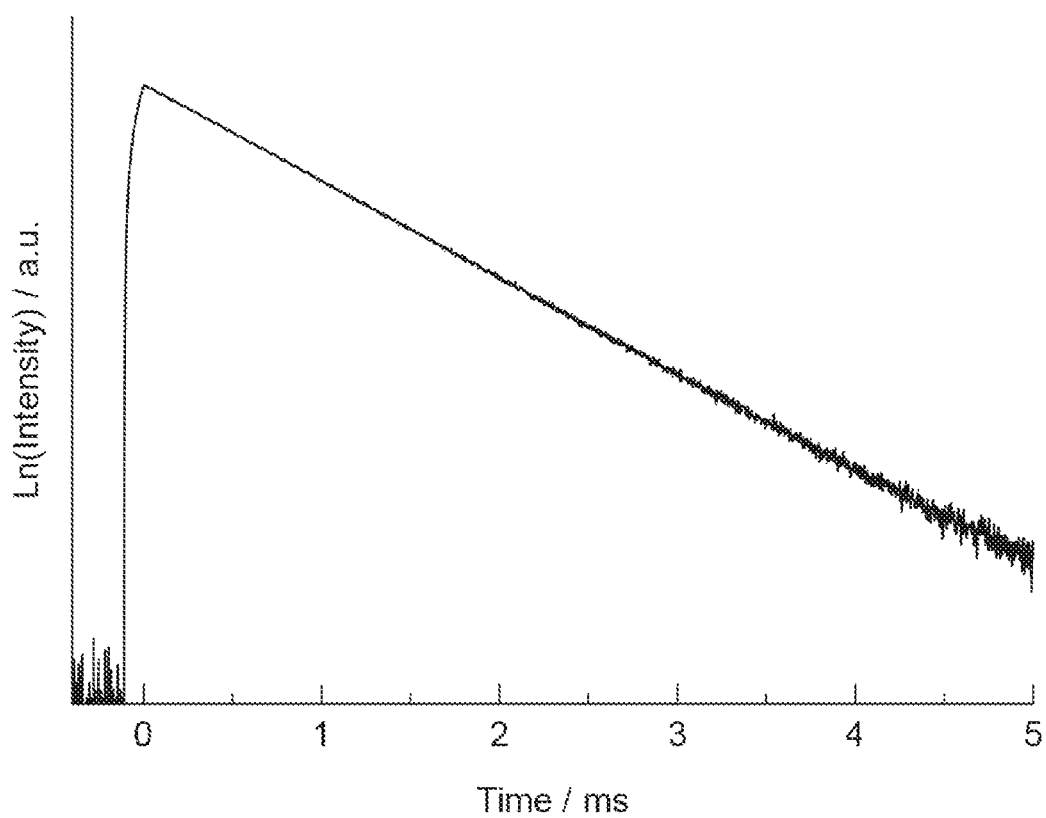
FIG. 6 shows a luminescence decay curve of a rare earth complex solution containing Eu(hfa)$_3$(tdmpo)$_2$.

To 25 mL of dichloromethane at room temperature, Eu(hfa)₃(TPPO)₂ (34.3 mg, 1 mmol) and 2 equivalents (23 mg, 2 mmol) or 7 equivalents (80 mg, 7 mmol) of tdmpo with respect to Eu(hfa)₃(TPPO)₂ were added. The luminescence properties of the obtained solution and the solution of Eu(hfa)₃(TPPO)₂ not added with tmpdo were evaluated. FIG. 5 shows emission spectra (excitation wavelength: 365 nm) of three solutions overlaid one on others. It is considered that the solution of Eu(hfa)₃(TPPO)₂:tdmpo=1:2 or 1:7 (equivalent ratio) shows the luminescence properties of Eu(hfa)₃(tdmpo)₂ generated in the solution. Both of the two solutions showed substantially the same spectrum. FIG. 6 shows a luminescence decay curve (excitation wavelength: 356 nm) of a solution of Eu(hfa)₃(TPPO)₂:tdmpo=1:2.

The solution of Eu(hfa)₃(TPPO)₂:tdmpo=1:2 or 1:7 (equivalent ratio) was applied onto a glass substrate, the coating film was dried, and thereby a transparent membrane was formed. When this membrane was irradiated with ultraviolet light, red luminescence was observed. On the other hand, when the solution of Eu(hfa)₃(TPPO)₂ was applied onto a glass substrate and the coating film was dried, whitening of the membrane attributable to the generation of crystal was recognized.

The above results indicate that the ligand substitution between TPPO and tdmpo was generated in the solution.

3. Formation of Membrane Containing Eu(Hfa)₃(TPPO)₂

3-1. Eu(hfa)₃(TPPO)₂/1,3,5-trimethoxybenzene

To 25 mL of dichloromethane at room temperature, Eu(hfa)₃(TPPO)₂ (34.3 mg, 1 mmol) and 1,3,5-trimethoxybenzene (8.4 mg, 2 mmol) were added. When the luminescence properties of the obtained solution were evaluated, red luminescence was shown at a high emission quantum yield of 60% by rare earth excitation. The obtained solution was applied onto a glass substrate, the coating film was dried, and thereby a membrane whose whitening attributable to crystallization is suppressed was formed. When the membrane was irradiated with ultraviolet light, red luminescence was observed. The emission quantum yield by rare earth excitation was 80%.

3-2. Eu(hfa)₃(TPPO)₂/2-hydroxy-4-methoxybenzaldehyde

To 5 mL of ethanol at room temperature, Eu(hfa)₃(TPPO)₂ (6.8 mg, 1 mmol) and 2-hydroxy-4-methoxybenzaldehyde (1.5 mg, 2 mmol) were added. When the luminescence properties of the obtained solution were evaluated, red luminescence was shown at a high emission quantum yield of 60% by rare earth excitation. The obtained solution was coated to a glass substrate, the coating film was dried, and thereby a membrane whose whitening attributable to crystallization is suppressed was formed. When the membrane was irradiated with ultraviolet light, red luminescence was observed. The emission quantum yield by rare earth excitation was 77%.

REFERENCE SIGNS LIST

1: transparent base material film, 3: luminescent membrane, 5: luminescent sheet, 7: skeleton, 10: vinyl greenhouse for agriculture.

The invention claimed is:

1. A rare earth complex comprising:
   a rare earth ion; and
   a phosphine oxide ligand coordinated with the rare earth ion, the phosphine oxide ligand being represented by the following formula (I):

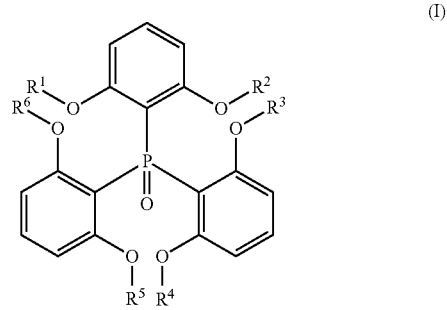

wherein $R^1$, $R^2$, $R^3$, $R^4$, $R^5$, and $R^6$ each independently represent an alkyl group which may have a substituent.

2. The rare earth complex according to claim 1, further comprising a ligand coordinated with the rare earth ion other than the phosphine oxide ligand and having a light sensitizing action.

3. A rare earth complex solution comprising:
   the rare earth complex according to claim 1; and
   a solvent in which the rare earth complex is dissolved.

4. A rare earth complex solution comprising:
   a rare earth complex;
   an aromatic compound that reduces the crystallinity of the rare earth complex; and
   a solvent in which the rare earth complex and the aromatic compound are dissolved.

5. The rare earth complex solution according to claim 4, wherein the aromatic compound is a compound represented by the following formula (10), (11), (12), or (13):

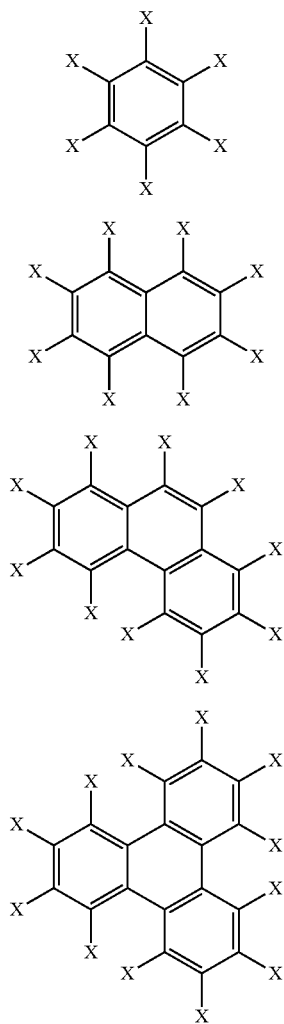

wherein X represents a hydrogen atom, a halogeno group, an alkoxy group which may have a substituent, a hydroxyl group, a nitro group, an amino group which may have a substituent, an alkylsulfonyl group which may have a substituent, an arylsulfonyl group which may have a substituent, a cyano group, a trialkoxysilyl group, a trialkylsilyl group, a phosphonic acid group, a diazo group, an alkylcarbonyloxy group which may have a substituent, an arylcarbonyloxy group which may have a substituent, an alkyloxycarbonyl group which may have a substituent, an aryloxycarbonyl group which may have a substituent, an aldehyde group, or a mercapto group, a plurality of Xs in the same molecule may be the same as or different from each other, and one or more of the plurality of Xs in the same molecule is a group containing an oxygen atom or a nitrogen atom.

6. A method for producing a luminescent molded article, the method comprising:
forming a membrane of the rare earth complex solution according to claim 3 on a base material; and
removing the solvent from the membrane to thereby form a membranous luminescent molded article containing the rare earth complex.

7. A luminescent molded article comprising the rare earth complex according to claim 1.

8. A luminescent molded article comprising:
a rare earth complex; and
an aromatic compound that reduces the crystallinity of the rare earth complex.

9. The luminescent molded article according to claim 8, wherein the aromatic compound is a compound represented by the following formula (10), (11), (12), or (13):

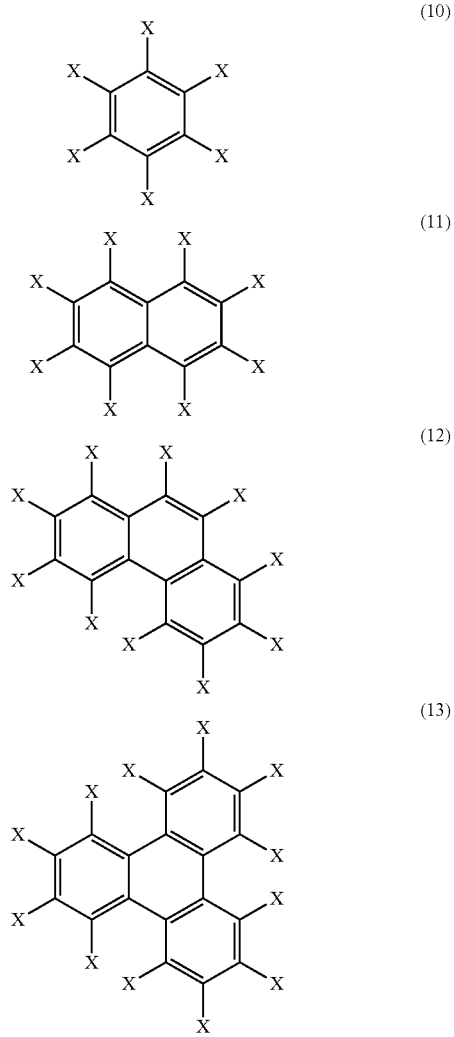

wherein X represents a hydrogen atom, a halogeno group, an alkoxy group which may have a substituent, a hydroxyl group, a nitro group, an amino group which may have a substituent, an alkylsulfonyl group which may have a substituent, an arylsulfonyl group which may have a substituent, a cyano group, a trialkoxysilyl group, a trialkylsilyl group, a phosphonic acid group, a diazo group, an alkylcarbonyloxy group which may have a substituent, an arylcarbonyloxy group which may have a substituent, an alkyloxycarbonyl group which may have a substituent, an aryloxycarbonyl group which may have a substituent, an aldehyde group, or a mercapto group, a plurality of Xs in the same molecule may be the same as or different from each other, and one or more of the plurality of Xs in the same molecule is a group containing an oxygen atom or a nitrogen atom.

10. A luminescent sheet comprising:
a transparent base material film; and
a membranous luminescent molded article provided on the transparent base material film, wherein
the luminescent molded article is the luminescent molded article according to claim 7.

11. The luminescent sheet according to claim 10, wherein the luminescent sheet is used for supplying red light to a plant.

12. A vinyl greenhouse for agriculture, comprising the luminescent sheet according to claim 10.

* * * * *